(12) United States Patent
Kiers et al.

(10) Patent No.: US 8,233,155 B2
(45) Date of Patent: Jul. 31, 2012

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Antoine Gaston Marie Kiers, Veldhoven (NL); Theodorus Lambertus Marinus Der Kinderen, Valkenswaard (NL); Vidya Vaenkatesan, Eindhoven (NL); Patrick Charles Maria Melis, Liempde (NL)

(73) Assignee: ASML Netherlands B.V., Veldhoven (NL)

( * ) Notice: Subject to any disclaimer, the term of this patent is extended or adjusted under 35 U.S.C. 154(b) by 216 days.

(21) Appl. No.: 11/580,246

(22) Filed: Oct. 13, 2006

(65) Prior Publication Data

US 2008/0088854 A1    Apr. 17, 2008

(51) Int. Cl.
*G01B 11/30* (2006.01)
(52) U.S. Cl. ................................. 356/600; 356/630
(58) Field of Classification Search .......... 356/369, 356/445, 600–601, 612, 635–636, 630
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | |
| 6,016,684 A | 1/2000 | Scheer et al. | |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |

(Continued)

FOREIGN PATENT DOCUMENTS

EP    1 628 164 A2    2/2006

(Continued)

OTHER PUBLICATIONS

Niu Xinhui, Specular Spectroscopic Scatterometry, May 2001, IEEE Transactions on Semiconductor Manufacturing, vol. 14, No. 2.*

(Continued)

*Primary Examiner* — Tarifur Chowdhury
*Assistant Examiner* — Michael P LaPage
(74) *Attorney, Agent, or Firm* — Sterne, Kessler, Goldstein & Fox P.L.L.C.

(57) ABSTRACT

In a scatterometric method, a roughness value can be obtained by using a model including a surface layer having a variable parameter relating to its refractive index.

19 Claims, 4 Drawing Sheets

U.S. PATENT DOCUMENTS

| | | | |
|---|---|---|---|
| 7,158,239 B2 | 1/2007 | Hazart | |
| 7,280,230 B2 | 10/2007 | Shchegrov et al. | |
| 7,301,649 B2 * | 11/2007 | Fabrikant et al. | 356/625 |
| 7,324,193 B2 | 1/2008 | Lally et al. | |
| 7,715,019 B2 * | 5/2010 | Kiers et al. | 356/601 |
| 2003/0168594 A1 * | 9/2003 | Muckenhirn | 250/307 |
| 2004/0119970 A1 | 6/2004 | Dusa et al. | 356/237.1 |
| 2006/0033921 A1 | 2/2006 | Den Boef et al. | 356/446 |
| 2006/0066855 A1 | 3/2006 | Der Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2006/0289789 A1 * | 12/2006 | Raymond et al. | 250/459.1 |
| 2007/0233404 A1 * | 10/2007 | Lally et al. | 702/35 |

FOREIGN PATENT DOCUMENTS

| | | | |
|---|---|---|---|
| EP | 1 628 164 A3 | 4/2006 | |
| JP | 2002-506217 A | 2/2002 | |
| JP | 2004-536314 A | 12/2004 | |
| JP | 2006-064496 A | 3/2006 | |
| JP | 2006-511799 A | 4/2006 | |
| JP | 2006-512561 A | 4/2006 | |
| JP | 2009-532869 A | 9/2009 | |
| WO | WO 2007/117434 A2 | 10/2007 | |

OTHER PUBLICATIONS

English language Abstract of Japanese Patent Publication No. 2006-064496 A, published Mar. 9, 2006, Japanese Patent Office (listed as document FP3 on the accompanying form PTO/SB/08a); 1 page.

English language translation of Japanese Notice of Reasons for Rejection, directed to related Japanese Patent Application No. 2007-261444, mailed Feb. 5, 2010 from the Japanese Patent Office; 3 pages.

English language translation of Japanese Notice of Reasons for Rejection, directed to related Japanese Patent Application No. 2007-261444, mailed Dec. 15, 2010 from the Japanese Patent Office; 3 pages.

* cited by examiner

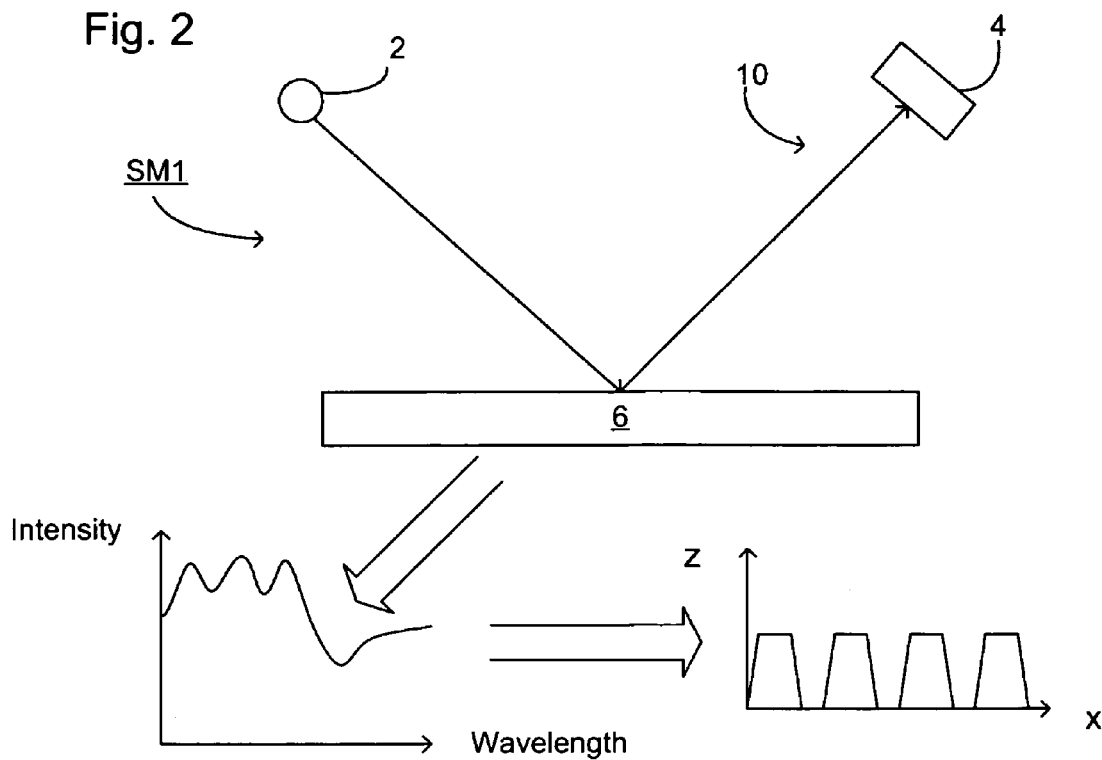
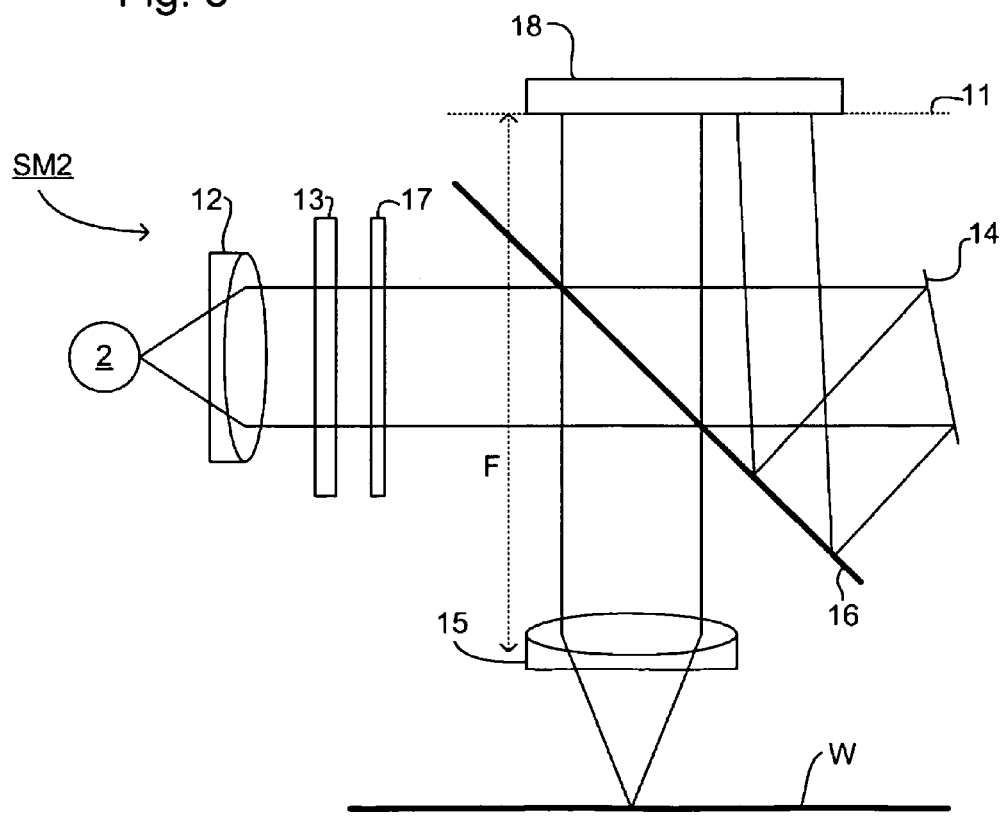

INSPECTION METHOD AND APPARATUS, LITHOGRAPHIC APPARATUS, LITHOGRAPHIC PROCESSING CELL AND DEVICE MANUFACTURING METHOD

FIELD

The invention relates to a method of inspection usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, one or more parameters of the patterned substrate, for example the overlay error between successive layers formed in or on it, are typically measured. There are various techniques, for making measurements of the microscopic structures formed in a lithographic process, including the use of a scanning electron microscope and various specialized tools. One form of specialized inspection tool is a scatterometer in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with data stored in a library of known measurements associated with a known substrate property. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle. An ellipsometer also measures polarization state.

An important parameter of a lithographic process is line edge roughness (LER). This is conventionally measured using top down critical dimension SEM (Scanning Electron Microscopy) or AFM (Atomic Force Microscopy). These techniques are well known and well developed but slow to carry out. Hence scatterometry, which is faster, is replacing these techniques for many measurements but until now, could not be used for line edge roughness. This is because a scatterometer measures an average response from the target area. A parameters relating to the average, such as critical dimension or sidewall angle, may be obtained to a high degree of accuracy, but roughness could not.

SUMMARY

It is desirable, for example, to provide a scatterometry method that can determine a roughness parameter of a target structure to be measured.

According to an aspect of the invention, there is provided a method of measuring a roughness parameter of a target pattern which has been printed on a substrate by a lithographic process, the method comprising:

directing an inspection beam of radiation onto the target pattern and measuring the radiation reflected or scattered therefrom to obtain measurement data; and processing the measurement data to obtain a value related to the roughness parameter, the processing based upon a model including a surface layer having a variable parameter relating to its refractive index.

According to an aspect of the invention, there is provided a device manufacturing method, comprising:

printing a target pattern and a device pattern in one or more fields on a substrate by a lithographic process;

directing an inspection beam of radiation onto the target pattern and measuring the radiation reflected or scattered therefrom to obtain measurement data; and processing the measurement data to obtain a value related to a parameter of the target pattern, the processing based upon a model including a surface layer having a variable parameter relating to its refractive index.

According to an aspect of the invention, there is provided an inspection apparatus configured to determine a value related to a parameter of a target pattern printed on a substrate by a lithographic process used to manufacture a device layer on a substrate, the apparatus comprising:

an illumination-optical system arranged to direct an inspection beam of radiation on to the target pattern;

a projection optical system arranged to project radiation reflected or scattered by the target pattern onto a detector to obtain a scatterometric spectra;

a calculator arranged to calculate the value using the scatterometric spectra; and a storage device arranged to store a model including a surface layer having a variable parameter relating to its refractive index.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a scatterometer according to an embodiment of the invention;

FIG. 3 depicts a further scatterometer according to an embodiment of the invention;

DETAILED DESCRIPTION

Figure 1A:
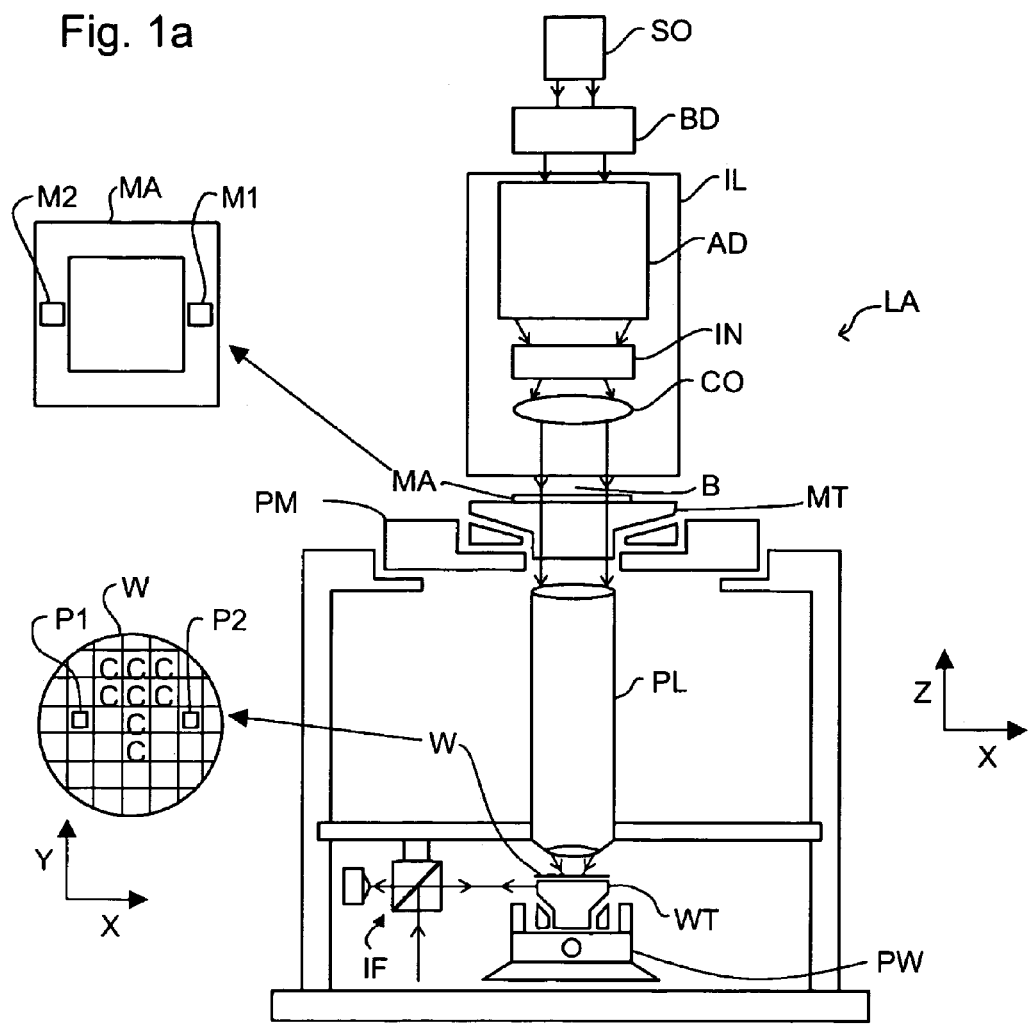
FIG. 1a depicts a lithographic apparatus.

FIG. 1a schematically depicts a lithographic apparatus. The apparatus comprises:

- an illumination system (illuminator) IL configured to condition a radiation beam B (e.g. UV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
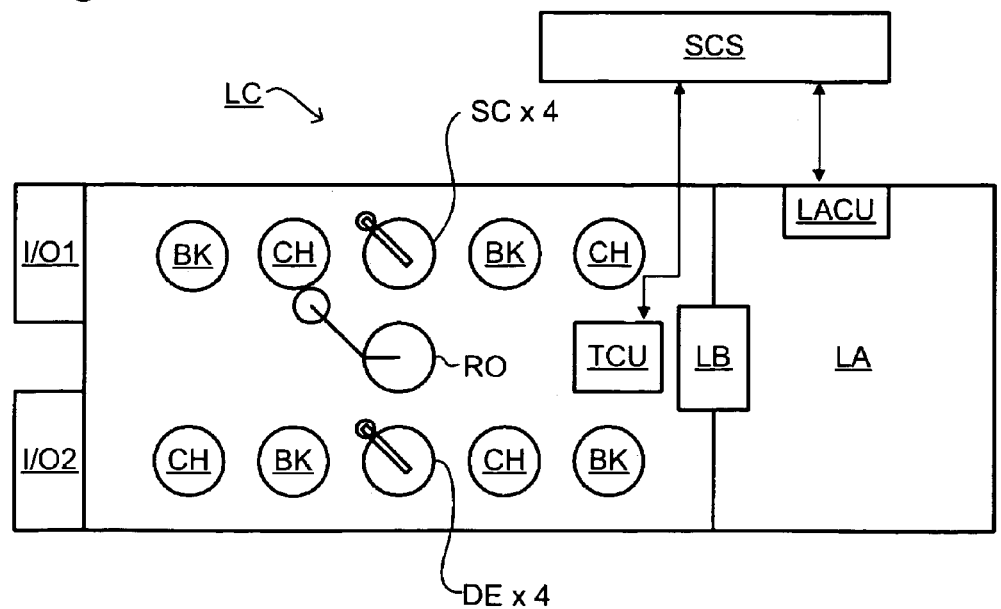
FIG. 1b depicts a lithographic cell or cluster.

As shown in FIG. 1b, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I,O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked—to improve yield—or discarded—thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

FIG. 2 depicts a scatterometer which may be used in an embodiment of the invention. It comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with an embodiment of the invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 is available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or a narrow wavelength range), the intensity separately at multiple wavelengths or the intensity integrated over a wavelength range. Further, the detector may separately measure the intensity of transverse magnetic- and transverse electric-polarized radiation and/or the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in European patent application publication EP1,628,164A, which document is hereby incorporated in its entirety by reference.

The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target.

There are two basic methods to determine the value of a parameter of interest of the target, e.g. CD, from the data (referred to as a spectrum) obtained from the scatterometer: iterative modeling and library searching. In the iterative modeling technique, a theoretical model of the target structure is used to calculate the spectrum that would be obtained from the target as a function of the parameter of interest. Starting with an initial or seed value, a predicted spectrum is calculated and compared to the measured spectrum so that the estimation of the parameter value can be improved. This process is repeated for a number of iterations until the predicted spectrum matches the measured spectrum to within a desired margin of error at which point it is assumed that the actual value of the parameter is equal to the predicted value of the parameter used to obtain the predicted spectrum to within a desired degree of precision.

In a library search, a library of predicted spectra is constructed, again using a model relating spectra to parameter values, and the measured spectra is compared to the library entries to determine the closest match. Interpolation between entries can be used to increase accuracy. The number of entries in the library is determined by the range of possible parameter values expected, which is dependent on how accurately the parameter value can be guessed in advance, and the desired accuracy of measurement.

Another technique that can be used in scatterometry is Principle Component Analysis (PCA). In this technique, a matrix of test or calibration patterns is printed with varying values of the parameter(s) of interest. Spectra are obtained for each of the test patterns and analyzed to derive a set of principle components (basis functions) so that each spectrum can be expressed by a set of coefficients multiplying the principle components. From the known parameter values of the test patterns, a function linking the coefficients to the parameter values can then be derived. A spectrum from a measurement target is decomposed into a set of coefficients multiplying the principle components and the coefficient values are used to determine the parameter values.

The basis of the analysis of any scatterometry data is a model of the pattern under inspection. A common form of target is a grating of simple lines which can be modeled as a trapezoid having three parameters: height h, width w and sidewall angle swa. More complex models involve stacked trapezoids and more complex shapes. Analysis of the scatterometry data then gives values for these three parameters of the grating under inspection. However, as the illuminated area of the measurement target is comparatively large, covering several tens of lines and a significant length of each line, the obtained values are necessarily averages. Conventional scatterometry analysis techniques do not give any information as to the variations in form. An embodiment of the invention proposes to provide such information by adding to a model one or more additional layers, outside of the conventional model components and covering some or all of the outer surface of the modeled feature, which is(are) parameterized by their thickness and refractive index. In conventional scatterometry analysis techniques, the refractive index of the different components of a model is known and regarded as a constant.

By providing one or more additional outermost layers with parameterized refractive index to a model, an improved fit between actual and calculated spectra may be obtained. An analysis of measurement data using such a model, which can be performed by known techniques as described above, generally provides a refractive index value that is between that of the modeled feature and that of the medium surrounding it (e.g., air or vacuum). This can be explained by considering that refractive index is a bulk phenomenon. Thus a rough line can be considered as a smooth line with random peaks projecting from it. To a first approximation, the base part of the enhanced model of an embodiment of the invention can be considered to represent the smooth line and the outermost layer the projecting peaks. The derived thickness and refractive index of the outermost layer are related to the height and volume of the peaks. It is believed that the refractive index obtained approximates to a volume average of the refractive index of the material of the peaks and that of the surrounding medium, the surface layer forming an effective medium that is a mixture of the material of the feature and the surrounding medium (e.g. air, gas or vacuum). Thus, where seed values are required for the applicable analysis technique, the layer thickness can be set to the expected peak-to-peak roughness value and the refractive index to a weighted average of the refractive indices of the feature material and the surrounding material. The obtained refractive index and layer thickness can be related to known measures, such as a 3-σ value on the top-down measurement line width, of line edge or surface roughness, either empirically or analytically. They may also be used as roughness measures in their own right.

Figure 4:
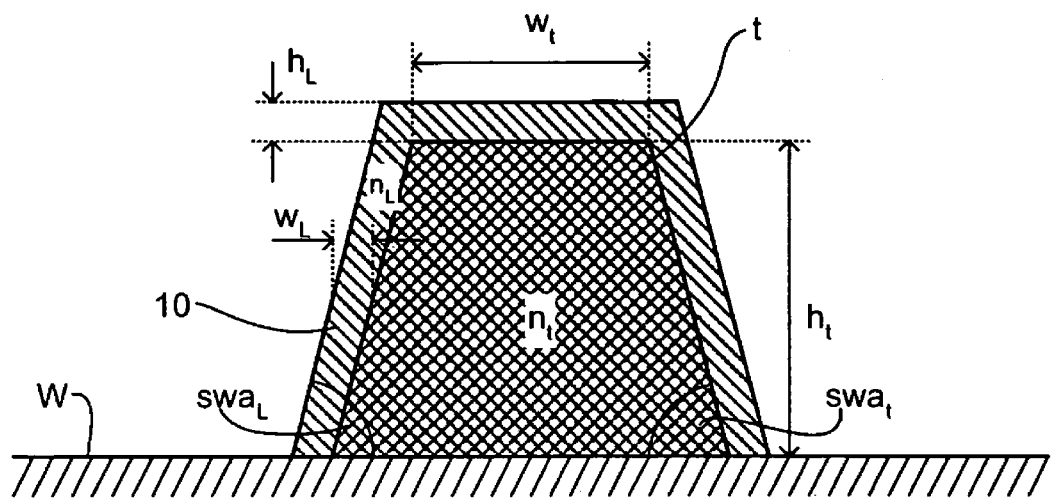
FIG. 4 depicts a model of a line in an embodiment of the invention.

FIG. 4 illustrates a model used in a simple embodiment of the invention. The model represents a line of a grating—all lines of which are considered identical—which is represented in cross-section by a simple trapezoid t parameterized by height $h_t$, width $w_t$ and sidewall angle $swa_t$. Such a model is a known and useful representation of a simple grating formed in resist. The resist is assumed to have a constant, known in advance refractive index $n_t$. To this, an embodiment of the invention adds a surface layer 10 which is parameterized by its width $w_L$ on the side wall of the trapezoid t, its thickness $h_L$ over the top of the trapezoid, its sidewall angle $swa_L$ and refractive index $n_L$. In even simpler models, $w_L$ and $h_L$ may be set the same and $swa_L$ may be set the same as $swa_t$. A simplest form of model may use fixed thickness values and parameterize only the refractive index of the surface layer 10.

Known simulation software can readily calculate spectra that would be expected as a result of scatterometry measurements of such a grating, for any desired combination of values of the described parameters. Therefore, a library of spectra for different parameter value sets can be generated and searched to identify the spectrum closest to a measured spectrum, and hence identify parameter values for the inspected target. Alternatively, the model can be used in an iterative process to find the parameter values.

Figure 5:
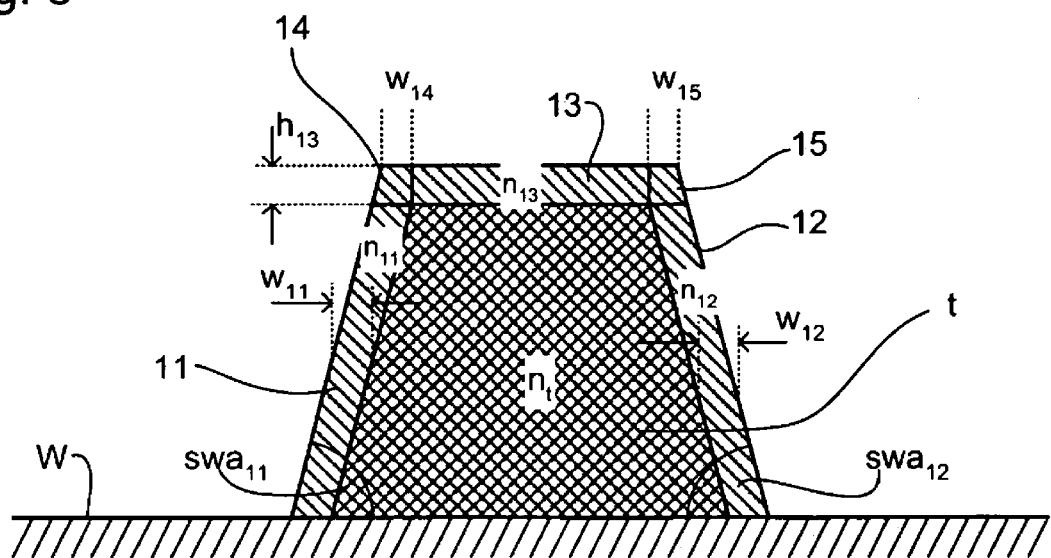
FIG. 5 depicts a model of a line in an embodiment of the invention.

A more complex model according to an embodiment of the invention is shown in FIG. 5. In this model, the same basic trapezoid t is used but the surface, or outermost layer, is represented by separate pieces 11-15 on the sides, top and corners of the trapezoid. The side pieces 11, 12 can be parameterized by their thicknesses $w_{11}$, $w_{12}$ and sidewall angles $swa_{11}$, $swa_{12}$. The top piece 13 by thickness $h_{13}$ and the corner pieces 14, 15 by thicknesses $w_{14}$ and $w_{15}$. Each piece has its own refractive index $n_{11-15}$ (not all shown in FIG. 5 for clarity). This model can also be simplified by setting the sidewall angles of the side pieces 11, 12 to be the same as that of the trapezoid and/or by setting the thicknesses of the corner pieces 14, 15 to be the same as the respective side pieces 11, 12. This model increases accuracy, and in particular enables asymmetry in the line roughness to be detected and, measured, but at the cost of increased computational time due to the increased number of parameters. A highly complex model might include multiple layers, one on top of another, having parameterized refractive indexes. It would be expected that the determined refractive index values would decrease toward the outside, representing the reduced filling factor of each layer. It will be appreciated that the additional surface layer(s) of an embodiment of the invention can be added to an underlying model of any level of complexity. The complexity of the model of the surface layer(s) may or may not be determined by the underlying model.

Figure 6:
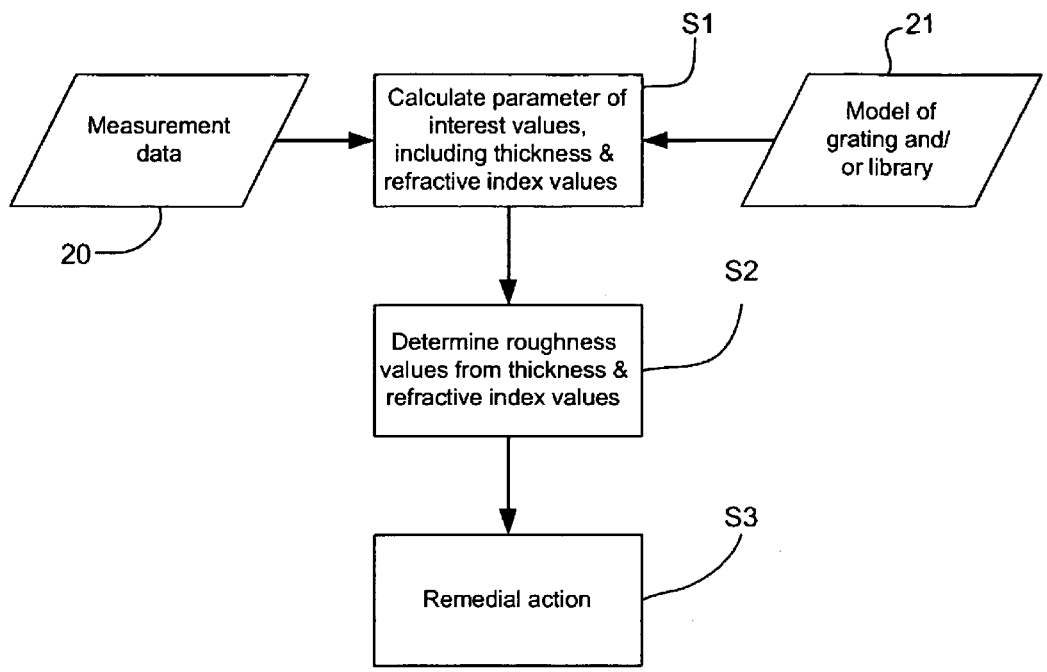
FIG. 6 is a flow chart of a method according to an embodiment of the invention.

An analysis method according to an embodiment of the invention is shown in FIG. 6. Measurement data 20 representing one or more scatterometry spectra is processed S1 to derive values for the parameter of interest, including thickness and refractive index parameters, referring to a model of the target or library of scatterometry spectra 21. Roughness values can then be obtained S2 from the thickness and/or refractive index values. If the thickness values indicate it is necessary, a remedial action, such as stripping and re-imaging, may be taken, S3.

Figure 7:
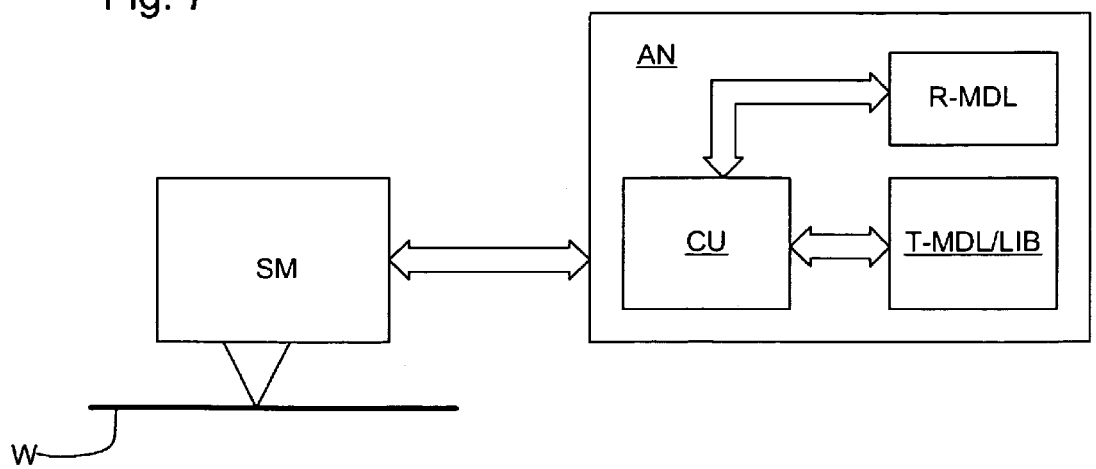
FIG. 7 depicts an inspection tool according to an embodiment of the invention.

The method may be effected by a scatterometry device as shown in FIG. 7. This device comprises a scatterometer SM, which may be of any of the types described above and is configured to generate the scatterometry data from one or more targets on a substrate, and an analysis unit AN configured to derive values of the parameter of interest from the scatterometry data. The analysis unit AN comprises a calculating unit CU configured to perform the various calculations necessary, a target model or library storage device T-MDL/LIB which stores a model of the scatterometry data as a function of the parameter of interest or pre-calculated spectra for different parameter values, and a roughness model storage device R-MDL which stores a model used to determine roughness values from the refractive index, and optionally thickness, values obtained from the scatterometry data. The analysis unit may be a specifically constructed device or may be embodied as software operating on a general purpose computer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring a line edge or surface roughness parameter of a target pattern, the method comprising:
    directing an inspection beam of radiation onto the target pattern and measuring the radiation using scatterometry which is reflected therefrom to obtain measurement data; and
    processing the measurement data to obtain a plurality of layer thicknesses and a plurality of angles from which the line edge or surface roughness parameter is obtained, the processing based upon a model including a surface layer having a variable parameter relating to its refractive index, wherein the plurality of layer thicknesses are a first and second side piece, a first and second corner piece, and a top piece, each with a separately determined refractive index, and wherein the plurality of angles are a first and second sidewall angle.

2. The method of claim 1, wherein the surface layer is represented in the model by a plurality of pieces having respective parameters.

3. The method of claim 2, wherein the model includes a feature having a known refractive index and different ones of the plurality of pieces are located on different surfaces of the feature.

4. The method of claim 2, wherein some of the plurality of pieces are stacked on each other.

5. The method of claim 1, wherein the surface layer is modeled by one or more variable parameters representing thickness and one or more variable parameters representing refractive index.

6. The method of claim 1, wherein the processing comprises a library search.

7. The method of claim 1, wherein the processing comprises an iterative calculation.

8. A method of analyzing scatterometry data including a line edge or surface roughness parameter obtained from a target pattern, the method comprising:
    processing the scatterometry data to obtain a plurality of layer thicknesses and a plurality of angles from which the line edge or surface roughness parameter is obtained, the processing based upon a model including a surface layer having a variable parameter relating to its refractive index, wherein the plurality of layer thicknesses are a first and second side piece, a first and second corner piece, and a top piece, each with a separately determined refractive index, and wherein the plurality of angles are a first and second sidewall angle.

9. An inspection apparatus configured to determine a value related to a line edge or surface roughness parameter of a target pattern, the apparatus comprising:
    an illumination system arranged to direct a beam of radiation on to the target pattern;
    an optical system arranged to direct radiation reflected by the target pattern onto a detector to obtain a scatterometric spectra;
    a calculating device arranged to determine a plurality of layer thicknesses and a plurality of angles from which the line edge or surface roughness parameter using the scatterometric spectra is obtained, wherein the plurality of layer thicknesses are a first and second side piece, a first and second corner piece, and a top piece, each with a separately determined refractive index, and wherein the plurality of angles are a first and second sidewall angle; and
    a storage device arranged to store a model including a surface layer having a variable parameter relating to its refractive index.

10. The apparatus of claim 9, wherein the surface layer is represented in the model by a plurality of pieces having respective parameters.

11. The apparatus of claim 10, wherein the model includes a feature having a known refractive index and different ones of the plurality of pieces are located on different surfaces of the feature.

12. The apparatus of claim 10, wherein some of the plurality of pieces are stacked on each other.

13. The apparatus of claim 9, wherein the surface layer is modeled by one or more variable parameters representing thickness and one or more variable parameters representing refractive index.

14. The apparatus of claim 9, wherein the calculating device is arranged to determine the thickness using a library search.

15. The apparatus of claim 9, wherein the calculating device is arranged to determine the thickness using an iterative calculation.

16. A device manufacturing method, comprising:
    printing a target pattern and a device pattern in one or more fields on a substrate;
    directing a beam of radiation onto the target pattern and measuring the radiation scattered therefrom to obtain measurement data; and
    processing the measurement data using scatterometry to obtain a plurality of layer thicknesses and a plurality of angles from which a line edge or surface roughness parameter of the target pattern is obtained, the processing based upon a model including a surface layer having a variable parameter relating to its refractive index, wherein the plurality of layer thicknesses are a first and second side piece, a first and second corner piece, and a top piece, each with a separately determined refractive index, and wherein the plurality of angles correspond to a first and second sidewall angle.

17. A lithographic apparatus comprising:
    an illumination optical system arranged to illuminate a pattern;

a projection optical system arranged to project an image of the pattern on to a substrate; and an inspection apparatus configured to determine a value related to a line edge or surface roughness parameter of a target pattern printed on a substrate, the apparatus comprising:

an illuminating system arranged to direct a beam of radiation on to the target pattern;

an optical system arranged to direct radiation from the target pattern onto a detector to obtain a scatterometric spectra;

a calculating device arranged to determine a plurality of layer thicknesses and a plurality of angles using the scatterometric spectra from which the line edge or surface roughness parameter of the target pattern is obtained, wherein the plurality of layer thicknesses are a first and second side piece, a first and second corner piece, and a top piece, each with a separately determined refractive index, and wherein the plurality of angles are a first and second sidewall angle; and a storage device arranged to store a model including a surface layer having a variable parameter relating to its refractive index.

18. A lithographic cell comprising:

a coater arranged to coat substrates with a radiation sensitive layer;

a lithographic apparatus arranged to expose images onto the radiation sensitive layer of substrates coated by the coater;

a developer arranged to develop images exposed by the lithographic apparatus; and an inspection apparatus configured to determine a value related to a line edge or surface roughness parameter of a target pattern, the apparatus comprising:

an illumination system arranged to direct a beam of radiation on to the target pattern;

an optical system arranged to direct radiation reflected or scattered by the target pattern onto a detector to obtain a scatterometric spectra;

a calculating device arranged to determine a plurality of layer thicknesses and a plurality of angles using the scatterometric spectra from which the line edge or surface roughness parameter of the target pattern is obtained, wherein the plurality of layer thicknesses are a first and second side piece, a first and second corner piece, and a top piece, each with a separately determined refractive index, and wherein the plurality of angles are a first and second sidewall angle; and a storage device arranged to store a model including a surface layer having a variable parameter relating to its refractive index.

19. The method of claim 1, wherein the value related to the line edge or surface roughness parameter is a critical dimension.

* * * * *

UNITED STATES PATENT AND TRADEMARK OFFICE
CERTIFICATE OF CORRECTION

| | | |
|---|---|---|
| PATENT NO. | : 8,233,155 B2 | Page 1 of 1 |
| APPLICATION NO. | : 11/580246 | |
| DATED | : July 31, 2012 | |
| INVENTOR(S) | : Kiers et al. | |

It is certified that error appears in the above-identified patent and that said Letters Patent is hereby corrected as shown below:

In column 12, line 63, claim 16, please delete "correspond to" and insert --are--

Signed and Sealed this
Twenty-eighth Day of August, 2012

David J. Kappos
*Director of the United States Patent and Trademark Office*